(12) United States Patent  (10) Patent No.: US 9,209,785 B2
Choi  (45) Date of Patent: Dec. 8, 2015

(54) REMOTE CONTROL APPARATUS

(75) Inventor: Yong Seok Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 766 days.

(21) Appl. No.: 13/407,999

(22) Filed: Feb. 29, 2012

(65) Prior Publication Data

US 2012/0229708 A1 Sep. 13, 2012

(30) Foreign Application Priority Data

Mar. 10, 2011 (KR) .................. 10-2011-0021421

(51) Int. Cl.
*G05B 11/01* (2006.01)
*H03J 1/00* (2006.01)
*H01H 9/02* (2006.01)

(52) U.S. Cl.
CPC ...... *H03J 1/0025* (2013.01); *H01H 2009/0257* (2013.01)

(58) Field of Classification Search
CPC ............... G05B 2219/2613; G05B 2219/2615; G05B 2216/34038; H04N 2005/4432; H04N 5/4403; H04N 21/4782; H04N 5/44582; G06F 1/162; G06F 2200/1614; G06F 1/1616; G06F 1/1624
USPC ...................................................... 340/12.55
See application file for complete search history.

(56) References Cited

U.S. PATENT DOCUMENTS

| | | | |
|---|---|---|---|
| 5,402,095 A * | 3/1995 | Janniere | G06K 7/0021 200/292 |
| 6,094,156 A | 7/2000 | Henty | |
| 6,407,779 B1 * | 6/2002 | Herz | H04N 5/44513 340/12.3 |
| 6,532,592 B1 * | 3/2003 | Shintani | H04N 5/4403 348/734 |
| 6,717,075 B1 | 4/2004 | Stavely et al. | |
| 7,123,242 B1 * | 10/2006 | Henty | G06F 3/021 340/815.6 |

(Continued)

FOREIGN PATENT DOCUMENTS

| | | |
|---|---|---|
| CN | 1536878 A | 10/2004 |
| DE | 10059981 A1 | 6/2002 |
| JP | 06254781 A | 9/1994 |

OTHER PUBLICATIONS

Raymond Wong, "Samsung's double-sided TV remote boasts a QWERTY keypad", Jan. 28, 2011, retrieved from the Internet: http://dvice.com/archives/2011/01/samsungs-double.php, retrieved on Jun. 5, 2012.

(Continued)

*Primary Examiner* — Naomi Small
(74) *Attorney, Agent, or Firm* — Sughrue Mion, PLLC

(57) ABSTRACT

A remote control apparatus which includes a first operation unit including a first key part having a plurality of keys operable when the remote control is in a first mode, a first control unit to generate a key signal corresponding to a key input through the first key part and a first transmission unit to transmit the key signal to the image apparatus, and a second operation unit including a second key part provided on a surface of the remote control apparatus, the second key part is different from the first key part and has a plurality of keys to be manipulated when the remote control is in a second mode, a second control unit to generate a key signal corresponding to a key input through the second key part, and a second transmission unit to transmit the key signal to the image apparatus.

38 Claims, 7 Drawing Sheets

(56) References Cited

U.S. PATENT DOCUMENTS

| | | | |
|---|---|---|---|
| 7,926,971 B2 * | 4/2011 | West | H01M 2/1055 320/107 |
| 8,288,035 B2 * | 10/2012 | Li | H01M 2/0245 429/121 |
| 2002/0070960 A1 * | 6/2002 | Maine | G11B 19/02 715/723 |
| 2004/0095326 A1 * | 5/2004 | Anderson | G06F 3/0213 345/168 |
| 2005/0054393 A1 | 3/2005 | Fagerstrom et al. | |
| 2005/0162569 A1 | 7/2005 | Fairhurst et al. | |
| 2008/0316041 A1 * | 12/2008 | Tsai | G06F 1/1626 340/670 |
| 2011/0025603 A1 | 2/2011 | Underkoffler et al. | |
| 2011/0181534 A1 * | 7/2011 | Palacios | G06F 3/0481 345/173 |
| 2011/0304542 A1 * | 12/2011 | Calderon | H04N 21/42214 345/163 |
| 2012/0140117 A1 * | 6/2012 | Waites | G08C 17/02 348/563 |

OTHER PUBLICATIONS

Richard Lawler, "Samsung's new dual-sided QWERTY remote for Smart TVs revealed by the FCC", Jan. 27, 2011, retrieved from the Internet: http://www.engadget.com/2011/01/27/samsungs-new-dual-sided-qwerty-remote-for-smart-tvs/, retrieved on Jun. 21, 2012.
Communication dated Jul. 9, 2012 issued by the European Patent Office in counterpart European Application No. 12157132.7.
Communication dated Jan. 6, 2014 issued by the State Intellectual Property Office of P. R. China in counterpart Chinese Application No. 201210060447.9.

* cited by examiner

REMOTE CONTROL APPARATUS

CROSS-REFERENCE TO RELATED APPLICATION

This application claims the benefit of priority from the Korean Patent Application No. 2011-0021421, filed on Mar. 20, 2011 in the Korean Intellectual Property Office, the disclosure of which is incorporated herein by reference in its entirety.

BACKGROUND

1. Field

Embodiments relate to a remote control apparatus with keys on both surfaces thereof.

2. Description of the Related Art

Each of electronic products distributed in homes, such as TVs, VCRs, DVD players and set top boxes, is provided with a remote controller, i.e., a remote control apparatus, for user's convenience.

For example, a remote controller to remotely control a TV includes a plurality of function selection buttons, a channel change button, a volume adjustment button, a printed circuit board on which a microcomputer is mounted which receives signals from the buttons and generates operating signals, a transmission sensor to transmit the generated operating signals, and batteries to supply drive power to the printed circuit board and the transmission sensor.

Such a remote controller transmits a channel change signal or an operation signal, such as a volume adjustment signal, to the TV in response to manipulation of a user watching the TV. Thereby, the user may conveniently adjust various functions of the TV.

Recently, as Internet is propagated and functions of electronic products are diversified, Internet TVs enabling Internet use and Internet set top boxes have been developed, and thus remote controllers to remotely control functions that are related to an Internet use in addition to a function related to watching a broadcast have been developed.

Such remote controllers are classified into a broadcast watching remote controller to watch a broadcast and an Internet remote controller to select an Internet function, and both remote controllers may be provided separately or integrally.

If the broadcast watching remote controller and the Internet remote controller are provided separately, storage and management of the respective remote controllers are cumbersome and, when switch between modes is carried out, the remote controller to control the corresponding function needs to be found. On the other hand, if the broadcast watching remote controller and the Internet remote controller are provided integrally, batteries are quickly consumed.

Further, when Internet is used through the Internet remote controller, a user inputs characters by pressing keys provided on the remote controller while watching the TV, input of the characters is inconvenient and a character input speed is low.

SUMMARY

Therefore, it is an aspect to provide a remote control apparatus which has a display unit to display characters input through an input unit, and a control method thereof.

It is another aspect to provide a remote control apparatus which transmits a first key signal for watching a broadcast and a second key signal for Internet using at least one of infrared rays (IR), a radio frequency (RF) and Bluetooth, and a control method thereof.

It is another aspect to provide a remote control apparatus with a tray to retract and extract batteries into and from a body, and a control method thereof.

It is another aspect to provide a remote control apparatus which has a locking member to fix a tray and elastic members to assist extraction of the tray, and a control method thereof.

It is a further aspect to provide a remote control apparatus having a trigonal prism shape, and a control method thereof.

Additional exemplary aspects will be set forth in part in the description which follows and, in part, will be obvious from the description, or may be learned by practice of the invention.

In accordance with one aspect, a remote control apparatus is provided. The remote control apparatus includes a first operation unit which has a first key part provided on one surface of the remote control apparatus and having a plurality of keys operable in a first mode, a first control unit which generates a key signal corresponding to a key input through the first key part, and a first transmission unit which transmits the generated key signal to the image apparatus, and a second operation unit which has a second key part provided on another surface of the remote control apparatus, where this key part is different from the first key part and has a plurality of keys operable in a second mode, a second control unit which generates a key signal corresponding to a key input through the second key part, and a second transmission unit which transmits the generated key signal to the image apparatus.

The remote control apparatus further includes a display unit to display a character of the key input through the second key part. The display unit may display the character the same as a character displayed on the image apparatus.

The remote control apparatus may further include one or more batteries to supply drive power to the respective units, and the first control unit may control power of the batteries supplied to the second control unit.

The remote control apparatus may further include a direction detection unit to detect the direction of at least one operation unit of the first operation unit and the second operation unit, and the first control unit may judge which operation unit is located upward based on a detection signal of the direction detection unit and control the power supplied to the second control unit upon judging that the second operation unit is located upward.

The direction detection unit may be one of an acceleration sensor and a gyro sensor.

The remote control apparatus may further include a body provided with a first surface and a second surface opposite to the first surface, the first operation unit may be provided on the first surface of the body, the second operation unit may be provided on the second surface of the body, and one side of the first operation unit and one side of the second operation unit may contact each other.

The side of the first operation unit and the side of the second operation unit contacting each other may form a designated angle.

The first transmission unit may execute infrared communication and the second transmission unit may execute one of Bluetooth communication and radio frequency communication.

Each of the first transmission unit and the second transmission unit may execute one of infrared communication, Bluetooth communication and radio frequency communication.

The first operation unit may further include a first input unit to receive the key signal from the first key part and to transmit the received key signal to the first control unit, and the second operation unit may further include a second input unit to receive the key signal from the second key part and to transmit the received key signal to the second control unit.

The remote control apparatus may further include a first printed circuit board on which the first input unit, the first control unit and the first transmission unit are provided, a second printed circuit board on which the second input unit, the second control unit and the second transmission unit are provided, a body on which the first printed circuit board and the second printed circuit board are respectively mounted and which is provided with a guide member, a tray on which one or more batteries to supply power to the first printed circuit board and the second printed circuit board are mounted and which slides along the guide member of the body, and a cover which opens and closes a hole through which the tray is extracted from and retracted into the body.

The remote control apparatus may further include a locking member which locks the tray or releases locking of the tray.

The locking member may include an elastic bias.

The tray may be provided with an extension part extended from one side surface thereof, and the locking member may be provided with a hanging part seated on the extension part.

The remote control apparatus may further include elastic members to assist extraction of the tray from the body.

The tray may include a first conductive member electrically connected to cathodes of the batteries and a second conductive member electrically connected to anodes of the batteries, and the first conductive member and the second conductive member may be connected to the first printed circuit board.

The elastic members may include a first spring connected to the second conductive member of the tray and a second spring connected to the first conductive member of the tray.

The batteries may include first to fourth batteries, the first battery and the second battery may be connected in series to form one pair, the third battery and the fourth battery may be connected in series to form another pair, and the pair which includes the first and second batteries may be connected in parallel to the pair which includes the third and fourth batteries.

The tray may include a first conductive member electrically connecting a cathode of the first battery and a cathode of the third battery and a second conductive member electrically connecting an anode of the second battery and an anode of the fourth battery.

The tray may further include a third conductive member electrically connecting an anode of the first battery and a cathode of the second battery to connect the first and second batteries in series and a fourth conductive member electrically connecting an anode of the third battery and a cathode of the fourth battery to connect the third and fourth batteries in series.

The tray may be retracted into and extracted from the body in a pushing manner.

The first mode may be a mode for watching a broadcast and the second mode may be a mode for using Internet.

The remote control apparatus may be formed in a trigonal prism shape.

In accordance with another aspect, a remote control apparatus is provided which includes a first operation unit including a first key part provided on one surface of the remote control apparatus and having a plurality of keys operable in a first mode, a first control unit which generates a key signal corresponding to a key input through the first key part and a first transmission unit which transmits the generated key signal to an image apparatus, and a second operation unit including a second key part provided on another surface of the remote control apparatus which is different from the first key part and having a plurality of keys operable in the second mode, a second control unit which generates a key signal corresponding to a key input through the second key part and a second transmission unit which transmits the generated key signal to the image apparatus through a communication channel different from the communication channel used by the first transmission unit.

The remote control apparatus may further include a body, a first radiation surface mounted on one surface of the body to radiate the signal of the first transmission unit, and a second radiation surface mounted on another surface of the body different from the first radiation surface to radiate the signal of the second transmission unit.

Each of the first operation unit and the second operation unit may include a bending part formed by partially bending one side thereof, and the remote control apparatus may further include a non-radiation surface being opposite the second radiation surface and formed by contact between the bending part of the first operation unit and the bending part of the second operation unit.

The second radiation surface and the non-radiation surface may have different thicknesses.

The first key part may be provided in a vertical direction and the second key part may be provided in a horizontal direction.

The first radiation surface may be provided at an upper portion of the first key part provided in a vertical direction and the second radiation surface may be provided at an upper portion of the second key part provided in the horizontal direction.

The first transmission unit may execute infrared communication and the second transmission unit may execute one of Bluetooth communication and radio frequency communication.

The remote control apparatus may further include a display unit which displays a character of the key input through the second key part, and the character displayed on the display unit is the same as a character displayed on the image apparatus.

BRIEF DESCRIPTION OF THE DRAWINGS

These and/or other aspects will become apparent and more readily appreciated from the following description of exemplary embodiments, taken in conjunction with the accompanying drawings of which.

DETAILED DESCRIPTION

Figure 1:
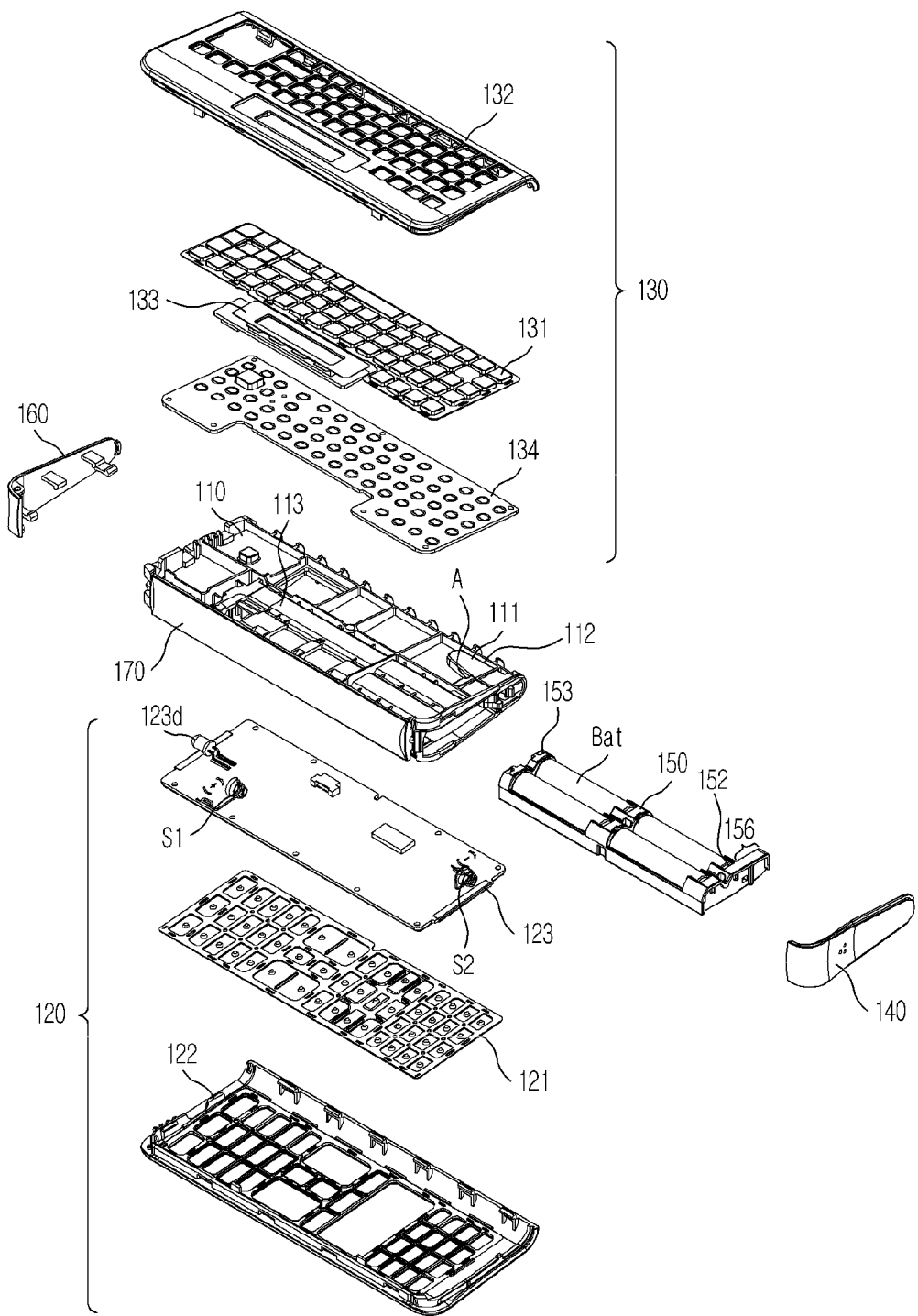
FIG. 1 is an exploded perspective view illustrating a remote control apparatus in accordance with an exemplary embodiment.

Reference will now be made in detail to the exemplary embodiments, examples of which are illustrated in the accompanying drawings, wherein like reference numerals refer to like elements throughout.

FIG. 1 is an exploded perspective view illustrating a remote control apparatus in accordance with an exemplary embodiment. A remote control apparatus 100 in accordance with the embodiment of the present invention includes a body 110, a first operation unit 120, a second operation unit 130, a cover 140, a tray 150, a first radiation surface 160 and a second radiation surface 170.

The body 110 has a trigonal prism shape. That is, the body 110 includes a first surface, a second surface installed opposite the first surface, and four side surfaces.

An accommodation part to accommodate the tray 150 is formed within the body 110, and a plurality of ribs is respectively formed on the first and second surfaces of the body 110.

The first operation unit 120 is mounted on the first surface of the body 110, and the second operation unit 130 is mounted on the second surface of the body 110. The cover 140 is mounted on one side surface of the body 110, the first radiation surface 160 is mounted on another side surface of the body 110, the second radiation surface 170 is mounted on a further side surface of the body 110, and a bending part of a first bezel 122 of the first operation unit 120 and a bending part of a second bezel 132 of the second operation unit 130 are located on the remaining side surface of the body 110.

Figure 2:
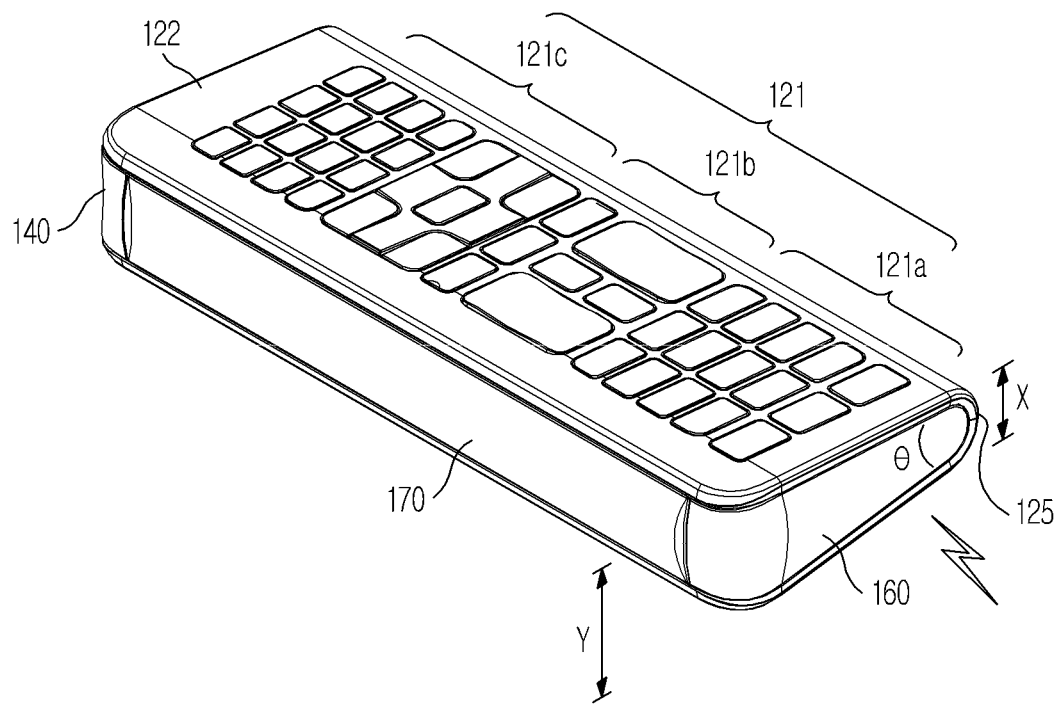
FIGS. 2 and 3 are exemplary views illustrating both surfaces of the remote control apparatus in accordance with an exemplary embodiment.

Here, the bending part of the first bezel 122 of the first operation unit 120 and the bending part of the second bezel 132 of the second operation unit 130 form a non-radiation surface 125 (shown in FIG. 2).

As shown in FIG. 2, the first surface and the second surface of the body 110 are placed at a designated angle $\theta$ with respect to each other, and thereby, a height X of the non-radiation surface 125 and a height Y of the second radiation surface 170 are different.

A first key part 121 and a first printed circuit board 123 of the first operation unit 120 are screw-connected to the first surface of the body 110, and a second key part 131 and a second printed circuit board 134 of the second operation unit 130 are screw-connected to the second surface of the body 110.

The first bezel 122 of the first operation unit 120 is hook-connected to the first surface of the body 110, and the second bezel 132 of the second operation unit 130 is hook-connected to the second surface of the body 110.

The plural ribs formed on the body 110 support the first printed circuit board 123 of the first operation unit 120 and the second printed circuit board 134 of the second operation unit 130.

The body 110 includes a locking member 111 to lock the tray 150 retracted into the body 110. Here, the locking member 111 includes an elastic bias elastically pushed to lock the tray 150 or to release the locking of the tray 150.

Such a locking member 111 includes a hanging part A having a hook-shaped end.

The hanging part A of the locking member 111 is hung onto an extension part 156 of the tray 150 when the tray 150 is retracted into the body 110, and releases locking of the tray 150 when the tray 150 is pushed by force of a user and thus the tray 150 is extracted from the body 110.

A fixing member 112 (also shown in FIG. 6) to fix a portion of the locking member 111 to mount the locking member 111 on the body 110 is provided on the body 110.

The body 110 further includes a guide member 113. Here, the guide member 113 is seated on a guide groove of the tray 150, and guides retraction and extraction of the tray 150 when the tray 150 is retracted into and extracted out of the body 110.

When the first operation unit 120, the second operation unit 130, the cover 140, the tray 150, the first radiation surface 160 and the second radiation surface 170 are mounted on the respective surfaces of the body 110, as described above, the remote control apparatus is formed in which the first operation unit 120 for watching broadcast of a TV, which is one of image apparatuses, and the second operation unit 130 for Internet are integrally provided.

Hereinafter, an exemplary remote control apparatus will be described in detail with reference to FIGS. 2 to 6.

The first operation unit 120 transmits a control signal of a first mode manipulated by a user to an image apparatus 200 (shown in FIG. 7) while the image apparatus 200 executes the first mode. Here, the first mode is a broadcast watching mode.

As shown in FIG. 1, a first operation unit 120 includes the first key part 121, the first bezel 122 and the first printed circuit board (PCB) 123.

As shown in FIG. 2, the first key part 121 includes a plurality of keys 121a, 121b and 121c to control the first mode, i.e., the broadcast watching mode, and the plural keys 121a, 121b and 121c are arranged in the vertical direction.

Here, the plural keys 121a, 121b and 121c include number keys 121a to input a channel, upward and downward keys 121b to raise or lower the channel or volume in stages, and function keys 121c to execute return to the earlier channel, automatic channel setting, selection of a menu, etc. These functional keys are provided by way of an example and not by way of a limitation. Other variations as is commonly known in the art are within the scope of an exemplary embodiment.

The first bezel 122 is stacked on the first key part 121, thus covering the first surface of the body 110 while fixing the first key part 121. Here, the first bezel 122 is provided with hook connection parts, and hooks provided on the first surface of the body 110 are connected to the hook connection parts of the first bezel 122.

The first bezel 122 is provided with a plurality of through holes formed at positions corresponding to the plural keys 121a, 121b and 121c of the first key part 121. That is, the plural keys 121a, 121b and 121c of the first key part 121 pass through the plural through holes of the first bezel 122, and then protrude outward. Thereby, key manipulation by the user is made easy.

The first bezel 122 is provided with the bending part at one side thereof. Such a bending part contacts the bending part of the second operation unit 130, and the two bending parts form the non-radiation surface 125.

The first printed circuit board 123 has plural contact points at positions corresponding to the plural keys 121a, 121b and 121c of the first key part 121, judges which key is pressed by the user by detecting an electrical signal generated when the contact point contacts one of the plural keys of the first key part 121, and transmits a signal of the judged key to the image apparatus 200.

Here, methods of judging the pressed key include a method of judging the pressed key by detecting an amount of charge at the contact point of the first printed circuit board 123 under the key, and a method of judging the pressed key by detecting whether or not there is a current flow when the key is attached to and detached from the contact point of the first printed circuit board 123 under the key. Here, the position of the judged key is converted into a key scan code through a BIOS, recorded in a buffer, and then transmitted to a first control unit.

The first printed circuit board 123 includes a first input unit to receive an electrical signal corresponding to pressing of the key from the plural contact points, the first control unit to judge the pressed key based on the position of the electrical signal and to generate a signal of the judged key, a first transmission unit 123*d* (shown in FIG. 1) to transmit the key signal to the image apparatus 200, and a power unit connected to batteries Bat to supply power of the batteries Bat to the respective units.

The first printed circuit board 123 further includes elastic members, i.e., a first spring S1 and a second spring S2 (shown in FIG. 1).

Here, as shown in FIG. 1, the first spring S1 and the second spring S2 apply elastic force to the tray 150 to assist extraction of the tray 150 when the tray 150 is extracted from the body 110, and are electrically connected to a first conductive member 152 and a second conductive member 153 of the tray 150 to receive power of the batteries and then to supply the power to the first printed circuit board 123 when the tray 150 is retracted into the body 110.

Here, the first transmission unit 123*d* is installed at the short side of the first printed circuit board 123, as shown in FIG. 1.

In more detail, since the plural keys are provided on the first operation unit 120 in the vertical direction and thus a user grips the remote control apparatus in the vertical direction during manipulating the first operation unit 120, the first transmission unit 123*d* is installed at the upper short side located to face the image apparatus 200 from among the upper and lower short sides of the first printed circuit board 123, thereby improving accuracy in communication.

As shown in FIG. 1, the first radiation surface 160 is located in the radiation direction of the first transmission unit 123*d* provided at the upper short side of the first printed circuit board 123. Thereby, a key signal of the first transmission unit 123*d* penetrates the first radiation surface 160, and the key signal having penetrated the first radiation surface 160 is transmitted to the image apparatus 200.

Here, the first transmission unit 123*d* uses infrared communication.

Further, the first transmission unit 123*d* may use radio frequency communication or Bluetooth communication.

As shown in FIG. 1, the first printed circuit board 123 is electrically connected to the batteries Bat and thus receive drive power supplied from the batteries Bat, and is electrically connected to the second printed circuit board 134 through the power unit and controls the power unit to control power of the batteries Bat supplied to the second printed circuit board 134.

In more detail, the first printed circuit board 123 judges a usage mode corresponding to a user's selection based on a direction detection signal transmitted from a direction detection unit 180 (shown in FIG. 7), receives drive power directly from the batteries Bat if the usage mode selected by the user is a first mode, and supplies the power of the batteries Bat to the second printed circuit board 134 if the usage mode selected by the user is a second mode.

The second operation unit 130 transmits a control signal provided by a user in the second mode to the image apparatus 200 while the image apparatus 200 executes the second mode. Here, the second mode is an Internet using mode.

Such a second operation unit 130 includes the second key part 131, the second bezel 132, a display unit 133, and the second printed circuit board (PCB) 134, as shown in FIG. 1.

Figure 3:
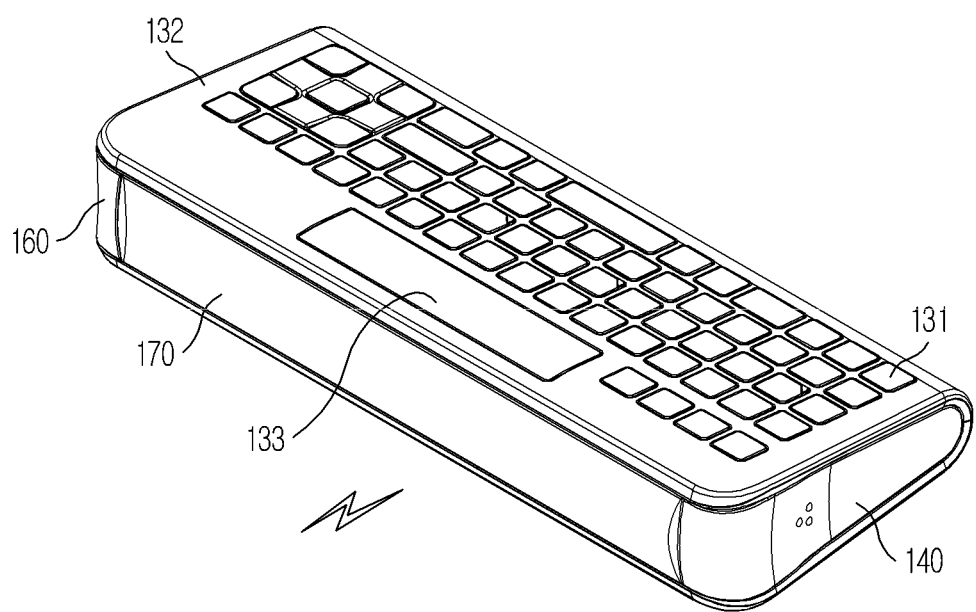

As shown in FIG. 3, the second key part 131 includes a plurality of keys that are manipulated when the remote device is in the second mode, i.e., the Internet using mode. These plural keys are arranged in the horizontal direction.

The plural keys provided on the second key part 131 include Korean keys, English keys, number keys, special character keys and function keys. These keys are provided by way of an example and not by way of a limitation. Other variations as is commonly known in the art are within the scope of an exemplary embodiment.

The second key part 131 may include one keyboard selected from the group consisting of a Korean two sets type keyboard, a Korean three sets type keyboard, an English qwerty keyboard and an English Devorak keyboard according key arrangement types.

Here, the English qwerty keyboard is a standard keyboard in U.S. in which keys representing English characters in the first line located under number keys are arranged in order of Q, W, E, R, T and Y from the left, and the English Devorak keyboard is a keyboard adopted by ANSI as a second standard in which frequently used keys are arranged at the central portion to improve an input speed.

The function keys of the second key part 131 include a control key Ctrl, an alternate key Alt, a shift key Shift, an enter key Enter, a tab key Tab, etc. These function keys are used to change the original meaning of a key, to control a program operation, or to move a text or a cursor. These key functionalities are provided by way of an example and not by way of a limitation. Other variations as is commonly known in the art are within the scope of an exemplary embodiment.

The second key part 131 may further include at least one of a mouse, a direction key and a touch pad to adjust the position of the cursor.

The second bezel 132 is stacked on the second key part 131, thus covering the second surface of the body 110 while fixing the second key part 131. Here, the second bezel 132 is provided with hook connection parts, and hooks provided on the second surface of the body 110 are connected to the hook connection parts of the second bezel 132.

The second bezel 132 is provided with a plurality of through holes formed at positions corresponding to the plural keys of the second key part 131. That is, the plural keys of the second key part 131 pass through the plural through holes of the second bezel 132, and then protrude outward. Thereby, key manipulation is made easy for the user.

The second bezel 132 is provided with the bending part at one side thereof. Such a bending part contacts the bending part of the first operation unit 120, and the two bending parts form the non-radiation surface 125 (see FIG. 1).

The display unit 133 includes a liquid crystal display (LCD), and displays characters input by a user by manipulating the second key part 121. Here, the characters displayed on the display unit 133 are characters for Internet connection, site connection, search, etc. which are the same as characters displayed on the image apparatus 200.

As described above, when characters are input to the second operation unit 130 to use Internet, the display unit 133 displays the input characters. As such, the user may easily and conveniently input characters without watching the image apparatus 200, thereby reducing the time it takes to input the characters.

The second printed circuit board 134 (shown in FIG. 1) has plural contact points at positions corresponding to the plural keys of the second key part 131, judges which key is pressed by the user by detecting an electrical signal generated when the contact point contacts one of the plural keys of the first key part 121, and transmits a signal of the judged key to the image apparatus 200.

Here, methods of judging the pressed key include a method of judging the pressed key by detecting an amount of charge at the contact point of the second printed circuit board 134 under the key, and a method of judging the pressed key by detecting whether or not there is a current flow when the key is attached to and detached from the contact point of the second printed circuit board 134 under the key. Here, the position of the judged key is converted into a key scan code through a BIOS, recorded in a buffer, and then transmitted to a second control unit.

The second printed circuit board 134 includes a second input unit to receive an electrical signal corresponding to pressing of the key from the plural contact points, the second control unit to judge the pressed key based on the position of the electrical signal and to generate a signal of the judged key, and a second transmission unit 134c (shown in FIG. 7) to transmit the key signal to the image apparatus 200.

Here, the second transmission unit 134c (shown in FIG. 7) is installed at the long side of the second printed circuit board 134.

That is, since the plural keys are provided on the second operation unit 130 in the horizontal direction and thus a user grips the remote control apparatus in the horizontal direction during the, manipulation of the second operation unit 130, the second transmission unit 134c is installed at the upper long side located to face the image apparatus 200 from among the upper and lower long sides of the second printed circuit board 134, thereby improving communication speed and accuracy of the second transmission unit 134c.

The second radiation surface 170 (shown in FIG. 3) is located in the radiation direction of the second transmission unit 134c (shown in FIG. 7) provided at the upper long side of the second printed circuit board 134. Thereby, a key signal of the second transmission unit 134c penetrates the second radiation surface 170, and the key signal having penetrated the second radiation surface 170 is transmitted to the image apparatus 200.

Here, the second transmission unit 134c uses radio frequency communication or Bluetooth communication.

The second key part 131 includes keys of larger number and more types of keys than the first key part 121. Therefore, type of data to be transmitted through the second operation unit 130 more widely varies. Further, characters input through the second key part 130 may include identifications and passwords of respective sites, thus requiring security.

Therefore, the second transmission unit 134c (shown in FIG. 7) uses radio frequency communication having high stability as wideband communication or Bluetooth communication.

Particularly, Bluetooth is usable at a low power and divides a frequency band, and thus divides data transmission throughout several frequencies, thereby is relatively safe against security threats due to wireless communication.

Further, radio frequency communication and Bluetooth communication enable curved communication, thereby easily executing communication even if there is an obstacle with the image communication.

Further, the second transmission unit 134c may use infrared communication from the economical point of view.

As shown in FIG. 1, the second radiation surface 170 is located in the radiation direction of the second transmission unit 134c provided at the upper long side of the second printed circuit board 134, and the non-radiation surface 125 (shown in FIG. 2) is located on the lower long side of the second printed circuit board 134.

Thereby, the key signal of the second transmission unit 134c penetrates the second radiation surface 170.

As shown in FIG. 1, the second printed circuit board 134 is electrically connected to the batteries Bat through the first printed circuit board 123, and receives power of the batteries Bat from the first printed circuit board 123.

In more detail, the second printed circuit board 134 judges the usage mode corresponding to the user selection based on a direction detection signal transmitted from the direction detection unit 180 (shown in FIG. 7), and receives power of the batteries Bat through the first printed circuit board 123 if the usage mode selected by the user is the second mode.

As shown in FIGS. 2 and 3, respectively, the first bezel 122 of the first operation unit 120 and the second bezel 132 of the second operation unit 130 form the designated angle θ, and thereby, the height X of the non-radiation surface 125 and the height Y of the second radiation surface 170 forming both side surfaces of the first bezel 122 and the second bezel 132 are different.

That is, the non-radiation surface 125 and the second radiation surface 170 forming both side surfaces of the first bezel 122 and the second bezel 132 are installed opposite each other and have different thicknesses.

As described above, the remote control apparatus is formed in a trigonal prism shape having a triangular cross section in which the thickness of the second radiation surface 170 is greater than the thickness of the non-radiation surface 125.

The cover 140 is detachably mounted on one side surface of the body 110 to open and close the inside of the body 110.

Such a cover 140 is separated from the body 110 in a sliding manner to open the body 110 when the tray 150 is extracted from the body 110, and is connected to the body 110 in the sliding manner to close the body 110 after the tray 150 is retracted into the body 110.

Figure 4:
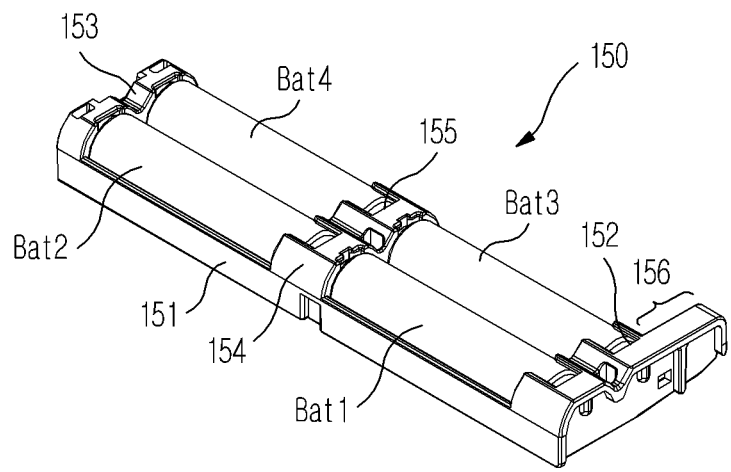
FIG. 4 is an exemplary view illustrating a tray of the remote control apparatus in accordance with an exemplary embodiment.

As shown in FIG. 4, the tray 150 accommodates a plurality of batteries Bat1 to Bat4, and is retracted into and extracted from the body 110 while holding the plural batteries Bat1 to Bat4.

As shown in FIG. 1, the tray 150 is electrically connected to the first printed circuit board 123 through the elastic members S1 and S2, and serves as a medium to transmit power of the batteries Bat1 to Bat4 to the first printed circuit board 123. The tray 150 will be described with reference to FIGS. 4 to 6.

As shown in FIG. 4, the tray 150 includes a plurality of accommodation parts 151, and the respective accommodation parts 151 hold the batteries Bat1 to Bat4.

Here, the first battery Bat1 and the second battery Bat 2 are connected in series to form a first pair, the second battery Bat3 and the fourth battery Bat4 are connected in series to form a second pair, and the first pair and the second pair are connected in parallel.

In order to achieve such a connection structure of the batteries Bat1 to Bat4, the tray 150 includes first to fourth conductive members. Hereinafter, this will be described in more detail.

The tray 150 includes a first conductive member 152 to which cathodes of the two batteries Bat1 and Bat3 are connected and which the second spring S2 (shown in FIG. 1) contacts, a second conductive member 153 to which anodes of the two batteries Bat2 and Bat4 are connected and which the first spring S1 (shown in FIG. 1) contacts, and a third conductive member 154 and a fourth conductive member 155 provided at the boundary between the two accommodation parts 151 to connect the two batteries in series.

Here, the anode of the first battery Bat1 is connected to one side surface of the third conductive member 154 and the cathode of the second battery Bat2 is connected to the other side surface of the third conductive member 154 to connect the first battery Bat1 and the second battery Bat2 in series, and the anode of the third battery Bat3 is connected to one side surface of the fourth conductive member 155 and the cathode of the fourth battery Bat4 is connected to the other side surface of the fourth conductive member 155 to connect the third battery Bat3 and the fourth battery Bat4 in series.

The tray 150 further includes the extension part 156 extending from the first conductive member 152 to one side.

The extension part 156 of the tray 150 includes a conductive member, and the conductive member of the extension part 156 is electrically connected to the first conductive member 152, and is electrically connected to the second spring S2 when the tray 150 is retracted into the body 110.

Here, the conductive member of the extension part 156 and the first conductive member 152 are formed integrally.

Figure 5:
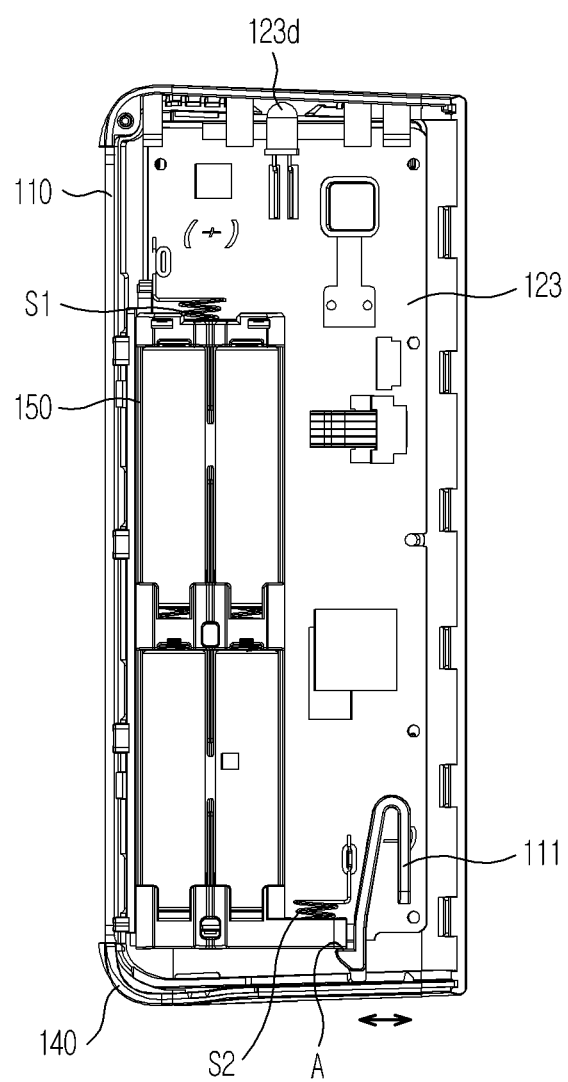
FIG. 5 is an exemplary view illustrating retraction of the tray of the remote control apparatus in accordance with an exemplary embodiment.

As shown in FIG. 5, the hanging part A of the locking member 111 is seated on the extension part 156 of the tray 150 when the tray 150 is retracted into the body 110, thereby preventing movement of the tray 150 due to external impact.

When the tray 150 is retracted into the body 110, the tray 150 is fixed by the locking member 111 and the first spring S1 and the second spring S2 are compressed.

Thereby, the second conductive member 153 (shown in FIG. 4) of the tray 150 contacts the first spring S1, and the first conductive member 152 of the tray 150 contacts the second spring S2. That is, the locking member 111 applies fixing force to the tray 150, thereby increasing accuracy in contact between the tray 150 and the elastic members, i.e., the springs S1 and S2.

Figure 6:
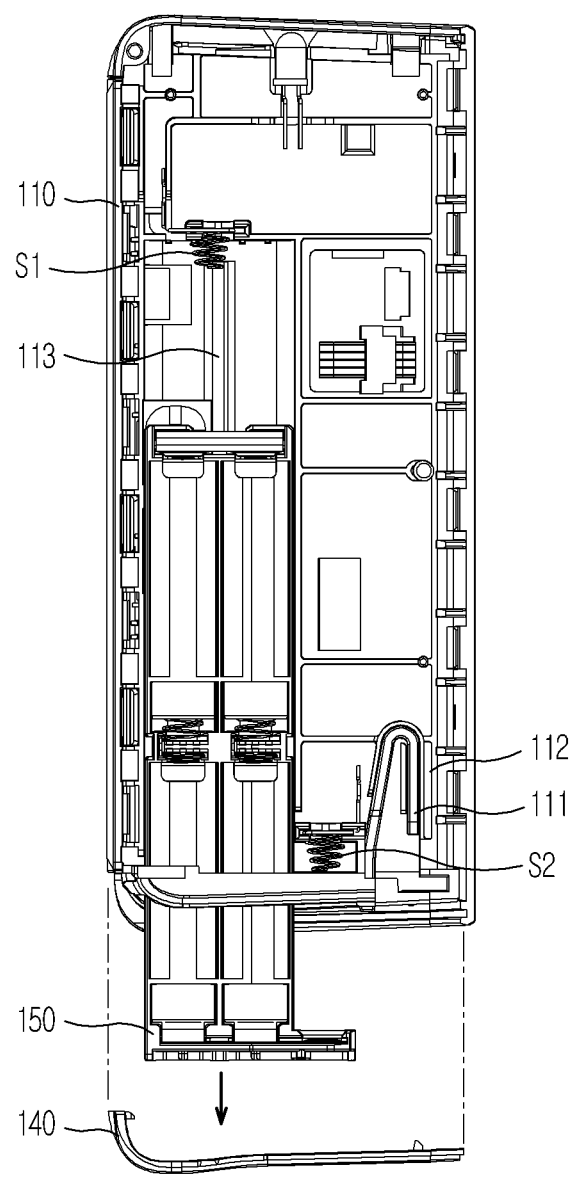
FIG. 6 is an exemplary view illustrating extraction of the tray of the remote control apparatus in accordance with an exemplary embodiment.

As shown in FIG. 6, when a user opens the cover 140 in the sliding member and pushes the hanging part A of the locking member 111 when the tray 150 is retracted into the main body 110, the hanging part A of the locking member 111 is released from the extension part 156 (shown in FIG. 4). At this time, the first and second springs S1 and S2 are restored to their original state due to the elasticity of the springs S1 and S2 and apply extracting force to the tray 150, and thus the tray 150 is extracted from the body 110. Thereafter, the hanging part A is restored to its original position due to its elasticity.

Further, the tray 150 may be extracted from and retracted into the body 110 in a tray pushing manner, or be extracted from and retracted into the body 110 in a pushing manner using a separate button.

Since the tray 150 includes the plural batteries mounted thereon to form a single battery pack, as described above, the batteries may be easily retracted into and extracted from the tray 150 and be safely protected from external impact.

Further, "AAA" type batteries may be used to achieve a slim structure, and four batteries of 1.5V may be used such that 3V is implemented by connecting each two batteries in series to increase the lifespan of the batteries.

The first radiation surface 160 (shown in FIG. 1) is installed at the short side of the body 110, includes a transparent window, and transmits the key signal of the first transmission unit 123d, i.e., an infrared signal.

The second radiation surface 170 (shown in FIG. 1) is installed at the long side of the body 110, includes a transparent window, and transmits the key signal of the second transmission unit 134c, i.e., a radio frequency signal or a Bluetooth signal.

Figure 7:
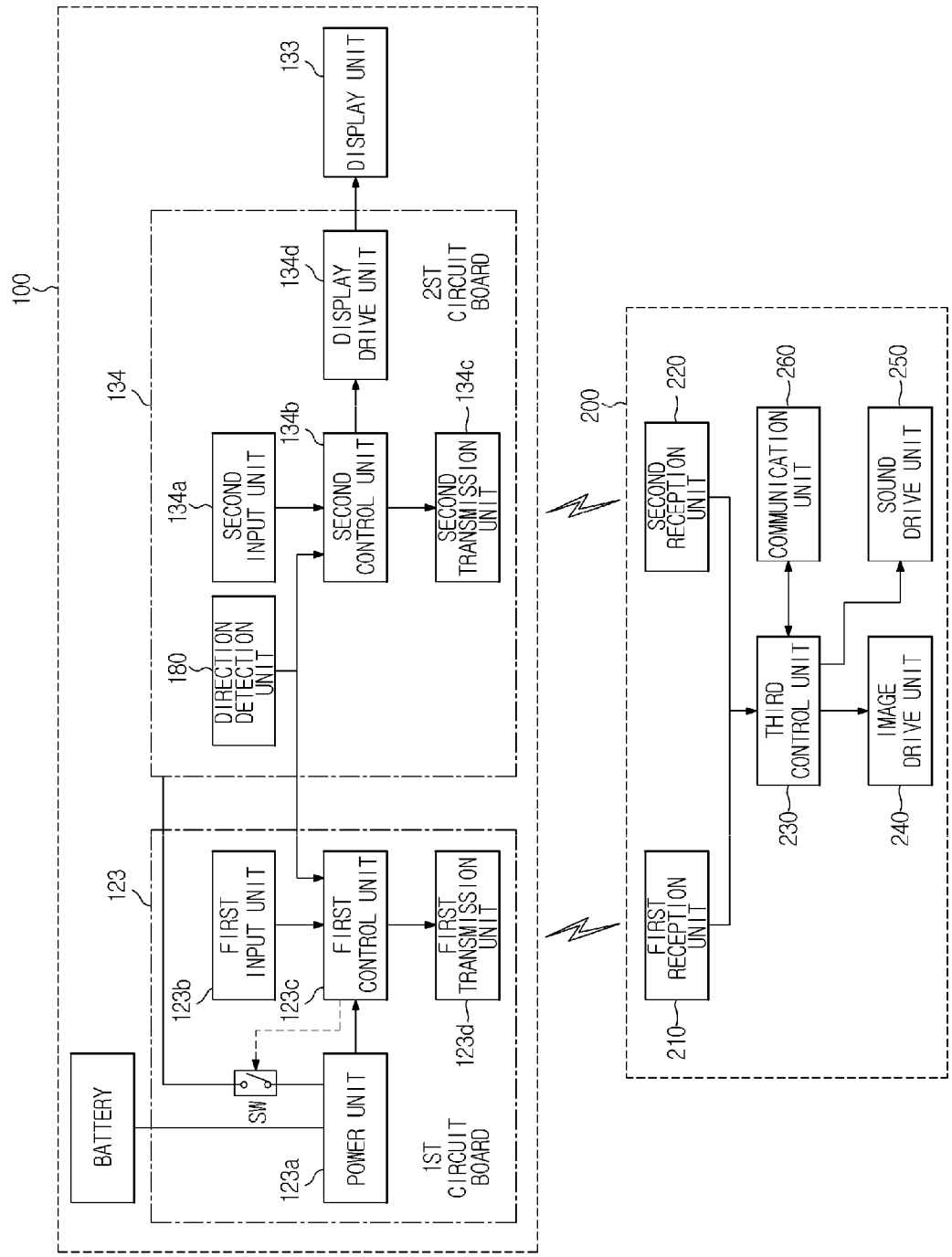
FIG. 7 is a control block diagram of the remote control apparatus in accordance with an exemplary embodiment.

FIG. 7 is a control block diagram illustrating a remote control apparatus in accordance with an exemplary embodiment. The remote control apparatus includes a power unit 123a, a first input unit 123b, a first control unit 123c and the first transmission unit 123d provided on the first printed circuit board 123, a second input unit 134a, a second control unit 134b, the second transmission unit 134c and a display drive unit 134d provided on the second printed circuit board 134, and the direction detection unit 180.

The power unit 123a supplies power of the batteries to the respective units. Further, the power unit 123a may convert the power of the batteries into voltages required to drive the respective units.

The remote control apparatus further includes a switch unit sw to control interception of power supplied to the first printed circuit board 123 and the second printed circuit board 134.

Such a switch unit sw is driven by a command from the first control unit 123c so that power of the batteries Bat may be supplied to the second printed circuit board 134 when the usage mode corresponding to user's intention is the second mode.

The switch unit sw may include a switch driven by a signal transmitted from the direction detection unit 180 or a sensor which is separately provided. Here, the separately provided sensor may be electrically or mechanically driven.

And the switch may be electrically or mechanically driven.

For example, if the switch is a switch driven by gravity, the switch is turned on or off corresponding to mechanically operated by gravity. The switch unit sw is turned off in the first mode, and is turned on in the second mode.

Further, the switch unit sw may be turned on and off according to user selection.

The power unit 123a may switch the power of the batteries so as to supply power supplied to the first printed circuit board 123 to the second printed circuit board 134 corresponding to a command of the first control unit 123c.

The first input unit 123b receives a signal indicating that a key was pressed by a user from among the plural keys provided on the first key part 121 of the first operation unit 120.

The first control unit 123c switches drive of the power unit 123a, the first input unit 123b and the first transmission unit 123d provided on the first printed circuit board 123 off when an operation signal (for example, an on signal) is transmitted from the direction detection unit 180, and switches drive of the power unit 123a, the first input unit 123b and the first transmission unit 123d provided on the first printed circuit board 123 on when a non-operation signal (for example, an off signal) is transmitted from the direction detection unit 180, thereby controlling the first mode corresponding to input through the first key part 121.

The first control unit 123c generates an infrared signal corresponding to the key signal transmitted from the first input unit 123b and controls transmission of the generated infrared signal, when it is judged that user's intention is to execute the first mode.

The first transmission unit 123d transmits the generated infrared signal to the image apparatus 200 corresponding to a command of the first control unit 123c.

Further, the first operation unit 120 may include a display unit to display a character corresponding to the key input by the user.

The second input unit 134a receives a signal indicating that a key was pressed by a user from among the plural keys provided on the second key part 131 of the second operation unit 130.

The second control unit 134b switches drive of respective drive units off when the non-operation signal (for example, the off signal) is transmitted from the direction detection unit 180, and switches drive of the respective drive units on when the operation signal (for example, the on signal) is transmitted from the direction detection unit 180, thereby controlling the second mode corresponding to input through the second key part 131.

The second control unit 134b generates a radio frequency signal corresponding to the key signal transmitted from the second input unit 134a, controls transmission of the generated radio frequency signal, and controls display of a character of the key transmitted from the second input unit 134*a*, when it is judged that user's intention is to execute the second mode.

If the second transmission unit 134*c* uses Bluetooth communication, the second control unit 134*b* generates a Bluetooth signal corresponding to the key signal transmitted from the second input unit 134*a*, and controls transmission of the generated Bluetooth signal.

The second transmission unit 134*c* transmits the generated radio frequency signal to the image apparatus 200 corresponding to a command of the second control unit 134*b*.

The display drive unit 134*d* displays the character of the key input through the second input unit 134*a* that correspond to a command of the second control unit 134*b*.

The direction detection unit 180 is mounted on the second printed circuit board 134, and detects which operation unit from among the first operation unit 120 and the second operation unit 130 faces upward using an acceleration sensor or a gyro sensor.

Such a direction detection unit 180 is operated so as to generate the operation signal when the second operation unit 130 faces upward, and is operated so as not to generate the operation signal when the second operation unit 130 faces downward, thus detecting the direction of the second operation unit 130.

That is, the direction detection unit 180 transmits the operation signal (for example, the on signal) to the first control unit 123*c* and the second control unit 134*b*, and transmits the non-operation signal (for example, the off signal) to the first control unit 123*c* and the second control unit 134*b*.

Thereby, the first control unit 123*c* and the second control unit 134*b* judge which operation unit from among the first operation unit 120 and the second operation unit 130 faces upward based on the operation signal transmitted from the direction detection unit 180, judges whether or not a mode intended by the user is the first mode or the second mode corresponding to a result of the judgment, and controls on or off the first operation unit 120 and the second operation unit 130 based on a result of the judgment.

Further, the direction detection unit 180 may be mounted on the first printed circuit board 123, or be mounted on the body 110 independently of the first printed circuit board 123 and the second printed circuit board 134.

The image apparatus 200 which receives the control signal from the remote control apparatus 100 and executes the first mode or the second mode includes a first reception unit 210, a second reception unit 220, a third control unit 230, an image drive unit 240, a sound drive unit 250 and a communication unit 260.

Here, the image apparatus 200 is a TV which executes the first mode for watching broadcast and the second mode for using Internet.

The first reception unit 210 receives the infrared signal transmitted from the first operation unit 120 and transmits the received infrared signal to the third control unit 230.

The second reception unit 220 receives the radio frequency signal or the Bluetooth signal transmitted from the second operation unit 130 and transmits the received radio frequency signal of Bluetooth signal to the third control unit 230.

The third control unit 230 judges a control command by analyzing the transmitted infrared signal and instructs the image drive unit 240 and the sound drive unit 250 to be driven based on the judged control command so as to output a broadcast signal, when the infrared signal is transmitted to the third control unit 230 through the first reception unit 210.

The third control unit 230 judges a control command by analyzing the transmitted radio frequency signal or Bluetooth signal and instructs the communication unit 260 to be driven and the image drive unit 240 and the sound drive unit 250 to be driven based on the judged control command so as to output an Internet image and sound, when the radio frequency signal or the Bluetooth signal is transmitted to the third control unit 230 through the second reception unit 220.

Further, the third control unit 230 controls the apparatus so as to display a character corresponding to the key signal of the second operation unit 130 transmitted through the second reception unit 220.

The image drive unit 240 outputs a broadcast image or an Internet image and displays of the character of the input key transmitted from the second operation unit 130 based on a command of the third control unit 230, and the sound drive unit 250 outputs a broadcast sound or an Internet sound based on the command of the third control unit 230.

The communication unit 260 is connected to Internet corresponding to a command of the third control unit 230. Such a communication unit 260 may be provided on the image apparatus 200, i.e., the TV or a set top box for the TV.

As described above, one remote control apparatus is used to input a control command to watch a broadcast and a control command to use Internet, thus conveniently achieving mode conversion. Further, the remote control apparatus is easily stored and maintained.

Further, when characters are input to use Internet, the remote control apparatus displays the input characters through a display unit (an LCD), thereby enabling a user to easily and conveniently input characters without watching an image apparatus, and reducing time it takes the user to input the characters.

Moreover, the remote control apparatus detects an operation unit intended to be used by the user through a direction detection unit (a gyro sensor) and enables only keys provided on the detected operation unit to be manipulated, thereby improving usage of the remote control apparatus.

As is apparent from the above description, a remote control apparatus in accordance with an exemplary embodiment is used to input a control command to watch a broadcast and a control command to use Internet, thus conveniently achieve mode conversion. Further, the remote control apparatus is easily stored and maintained.

Further, when characters are input to use Internet, the remote control apparatus displays the input characters through a display unit (an LCD), thereby enabling a user to easily and conveniently input characters without watching an image apparatus, and reducing time to input the characters.

Further, the remote control apparatus has a signal transmission unit for watching a broadcast and a signal transmission unit for Internet installed on different surfaces in consideration of a gripping direction and a key manipulating direction, thereby improving accuracy in key signal transmission.

Further, the remote control apparatus having a trigonal prism-shaped external appearance corresponding to gripping of the remote control apparatus, thus being easily gripped by a user.

Further, the remote control apparatus transmits a key signal for watching broadcast using infrared rays (IR) and transmits a key signal for Internet using a radio frequency (RF) or Bluetooth, thereby raising accuracy in key signal transmission while reducing production costs.

Further, the remote control apparatus has a plurality of batteries mounted on a tray to form a single battery pack, thereby easily retracting and extracting the batteries into and from a body and safely protecting the battery from external impact.

Moreover, the remote control apparatus implements 3V using four batteries of 1.5V by connecting each two batteries in series to increase the lifespan of the batteries, and detects an operation unit intended to be used by the user through a direction detection unit (a gyro sensor) and then enables only keys provided on the detected operation unit to be manipulated, thereby improving usage of the remote control apparatus.

Although a few exemplary embodiments have been shown and described, it would be appreciated by those skilled in the art that changes may be made in these exemplary embodiments without departing from the principles and spirit of the invention, the scope of which is defined in the claims and their equivalents. As described above, exemplary embodiments are merely exemplary and are not to be construed as limiting. Those skilled in the art can implement various changes and modifications from the above description of exemplary embodiments. Moreover, various modifications to these exemplary embodiments will be readily apparent to those skilled in the art, and the generic principles and specific examples defined herein may be applied to other embodiments.

What is claimed is:

1. A remote control apparatus comprising:
   a first operation unit comprising:
      a first key part which is provided on one surface of the remote control apparatus and which has a plurality of keys operable in a first mode,
      a first control unit which generates a key signal corresponding to a key input through the first key part, and
      a first transmission unit which transmits the generated key signal to an image apparatus; and
   a second operation unit comprising:
      a second key part which is provided on another surface of the remote control apparatus and which has a plurality of keys operable in a second mode,
      a second control unit which generates a key signal corresponding to a key input through the second key part,
      a display unit which is provided on said another surface of the remote control along with the second key part and which displays characters that are input through the second key part, and
      a second transmission unit which transmits the generated key signal to the image apparatus,
   wherein the display unit displays the characters, which are same as characters displayed on the image apparatus during input of the characters via the second key part.

2. The remote control apparatus according to claim 1, further comprising at least one battery to supply drive power to the first operating unit and the second operating unit,
   wherein the first control unit controls power of the at least one battery so that the power is supplied to the second control unit.

3. The remote control apparatus according to claim 2, further comprising a direction detection unit which detects a direction of at least one operation unit among the first operation unit and the second operation unit,
   wherein the first control unit judges which operation unit is located upward based on a detection signal from the direction detection unit, and
   wherein if the second operation unit is located upward, the first control unit controls the power to be supplied to the second control unit.

4. The remote control apparatus according to claim 3, wherein the direction detection unit is one of an acceleration sensor and a gyro sensor.

5. The remote control apparatus according to claim 1, further comprising a body provided with a first surface and a second surface opposite to the first surface,
   wherein the first operation unit is provided on the first surface of the body, the second operation unit is provided on the second surface of the body, and one side of the first operation unit and one side of the second operation unit contact each other.

6. The remote control apparatus according to claim 5, wherein the side of the first operation unit and the side of the second operation unit contacting each other form a predetermined angle.

7. The remote control apparatus according to claim 1, wherein:
   the first transmission unit executes infrared communication; and
   the second transmission unit executes one of Bluetooth communication and radio frequency communication.

8. The remote control apparatus according to claim 1, wherein each of the first transmission unit and the second transmission unit executes one of infrared communication, Bluetooth communication and radio frequency communication.

9. The remote control apparatus according to claim 1, wherein:
   the first operation unit further comprises a first input unit to receive the key signal from the first key part and to transmit the received key signal to the first control unit; and
   the second operation unit further comprises a second input unit to receive the key signal from the second key part and to transmit the received key signal to the second control unit.

10. The remote control apparatus according to claim 9, further comprising:
    a first printed circuit board on which the first input unit, the first control unit and the first transmission unit are provided;
    a second printed circuit board on which the second input unit, the second control unit and the second transmission unit are provided;
    a body on which the first printed circuit board and the second printed circuit board are respectively mounted and which is provided with a guide member;
    a tray on which at least two batteries to supply power to the first printed circuit board and the second printed circuit board are mounted and which slides along the guide member of the body; and
    a cover which opens and closes a hole through which the tray is extracted from and retracted into the body.

11. The remote control apparatus according to claim 10, further comprising a locking member which locks the tray or which releases locking of the tray.

12. The remote control apparatus according to claim 11, wherein the locking member comprises an elastic bias.

13. The remote control apparatus according to claim 11, wherein:
    the tray is provided with an extension part extended from one side surface thereof; and
    the locking member is provided with a hanging part seated on the extension part.

14. The remote control apparatus according to claim 10, further comprising elastic members to assist extraction of the tray from the body.

15. The remote control apparatus according to claim 14, wherein:
the tray comprises a first conductive member electrically connected to cathodes of the at least two batteries and a second conductive member electrically connected to anodes of the at least two batteries; and
the first conductive member and the second conductive member are connected to the first printed circuit board.

16. The remote control apparatus according to claim 15, wherein the elastic members comprise:
a first spring connected to the second conductive member of the tray; and
a second spring connected to the first conductive member of the tray.

17. The remote control apparatus according to claim 10, wherein:
the at least two batteries comprise a first battery, a second battery, a third battery, and a fourth battery;
the first battery and the second battery are connected in series to form one pair;
the third battery and the fourth battery are connected in series to form another pair; and
the pair comprising the first and second batteries is connected to the pair comprising the third and fourth batteries in parallel.

18. The remote control apparatus according to claim 17, wherein the tray comprises:
a first conductive member which electrically connects a cathode of the first battery and a cathode of the third battery; and
a second conductive member which electrically connects an anode of the second battery and an anode of the fourth battery.

19. The remote control apparatus according to claim 18, wherein the tray further includes:
a third conductive member which electrically connects an anode of the first battery and a cathode of the second battery to connect the first and second batteries in series; and
a fourth conductive member which electrically connects an anode of the third battery and a cathode of the fourth battery to connect the third and fourth batteries in series.

20. The remote control apparatus according to claim 10, wherein the tray is retracted into and extracted from the body in a pushing manner.

21. The remote control apparatus according to claim 1, wherein the first mode is a mode for watching a broadcast and the second mode is a mode for using Internet.

22. The remote control apparatus according to claim 1, wherein the remote control apparatus is formed in a trigonal prism shape such that the first key part and the second key part with the display unit are on opposite outer surfaces of the trigonal prism shape.

23. The remote control apparatus of claim 1, further comprising:
a display drive unit configured to drive the display unit; and
a direction detection unit configured to detect a direction of at least one operation unit among the first operation unit and the second operation unit,
wherein the second control unit controls both the display drive unit and the second transmission unit such that both are operated based on the direction detection unit, and
wherein the first transmission unit and the second transmission unit utilize different communication protocols from each other.

24. A remote control apparatus comprising:
a first operation unit comprising:
a first key part provided on one surface of the remote control apparatus and having a plurality of keys operable in a first mode,
a first control unit which generates a key signal corresponding to a key input through the first key part, and
a first transmission unit to transmit the generated key signal to an image apparatus; and
a second operation unit comprising:
a second key part provided on another surface of the remote control apparatus, where the second key part is different from the first key part and has a plurality of keys operable in a second mode,
a second control unit which generates a key signal corresponding to a key input through the second key part, and
a second transmission unit which transmits the generated key signal to the image apparatus through a communication which is different from the communication of the first transmission unit,
a body on which the first key part and the second key part are provided;
at least two batteries to supply drive power to the first operating unit and the second operating unit;
a tray which accommodates at least two batteries and slides in the body;
a cover which opens and closes a hole of the body through which the tray is extracted from and retracted into the body;
an extension part which is extended from one side surface of the tray; and
a locking member provided with a hanging part seated on the extension part,
wherein the hanging part is separated from the extension part as the cover slides upon retraction of the tray.

25. The remote control apparatus according to claim 24, further comprising:
a body;
a first radiation surface mounted on one surface of the body to radiate the signal of the first transmission unit; and
a second radiation surface mounted on another surface of the body to radiate the signal of the second transmission unit.

26. The remote control apparatus according to claim 24, wherein:
each of the first operation unit and the second operation unit comprises a bending part formed by partially bending one side thereof; and
the remote control apparatus further comprises a non-radiation surface being opposite to the second radiation surface and formed by contact between the bending part of the first operation unit and the bending part of the second operation unit.

27. The remote control apparatus according to claim 26, wherein the second radiation surface and the non-radiation surface have different thicknesses.

28. The remote control apparatus according to claim 24, wherein the first key part is provided in a vertical direction, and the second key part is provided in a horizontal direction.

29. The remote control apparatus according to claim 28, wherein the first radiation surface is provided at an upper portion of the first key part and the second radiation surface is provided at an upper portion of the second key part.

30. The remote control apparatus according to claim 24, wherein:
- the first transmission unit executes infrared communication; and
- the second transmission unit executes one of Bluetooth communication and radio frequency communication.

31. The remote control apparatus according to claim 24, further comprising a display unit which displays a character of the key input through the second key part, and the character displayed on the display unit is same as a character displayed on the image apparatus.

32. The remote control apparatus according to claim 24, further comprising:
- a direction detection unit which detects a direction of at least one operation unit among the first operation unit and the second operation unit,
- wherein if the first operation unit is located upward, the remote control apparatus operates in the first mode,
- wherein if the second operation unit is located upward, the remote control apparatus operates in the second mode.

33. The remote control apparatus according to claim 32, further comprising a body on which the first operation unit and the second operation unit is mounted, wherein the direction detection unit is mounted in the first operation unit.

34. The remote control apparatus according to claim 32, further comprising a body on which the first operation unit and the second operation unit is mounted, wherein the direction detection unit is mounted outside of the first operation unit and the second operation unit.

35. The remote control apparatus according to claim 24, wherein the first key part provides functionality different from the second key part.

36. The remote control apparatus of claim 1, wherein the display unit is provided on said another surface of the remote control and is operational only when power is supplied to the second operation unit and is turned off when power is supplied to the first operation unit.

37. The remote control apparatus of claim 24, wherein the first operation unit is position on a first printed circuit board and the second operation unit is positioned on the second printed circuit board, wherein the remote control apparatus further comprises a sensor which detects one of the first operation unit and the second operation unit being placed in an upward direction and a switch, which is driven by a command transmitted from the sensor based on said detection and which supplies power from a power source to one of the first printed circuit board and the second printed circuit board based on the command.

38. The remote control apparatus according to claim 24, wherein the first transmission unit and the second transmission unit are installed on opposite surfaces from each other based on a gripping direction and key manipulating direction, wherein the remote control apparatus has a trigonal prism-shaped external appearance corresponding to gripping of the remote control, and wherein the first transmission unit transmits a key signal for watching a broadcast on a television via infrared rays communication protocol and the second transmission unit transmits a key signal for Internet via a radio frequency communication protocol.

* * * * *